United States Patent [19]

Thornburg et al.

[11] 4,264,646

[45] Apr. 28, 1981

[54] SELECTIVELY ELECTROLESSLY DEPOSITING A METAL PATTERN ON THE SURFACE OF A LAMINAR FILM

[75] Inventors: David D. Thornburg, Los Altos; Thomas J. Kloffenstein, Jr., Sunnyvale, both of Calif.

[73] Assignee: Xerox Corporation, Stamford, Conn.

[21] Appl. No.: 19,820

[22] Filed: Mar. 12, 1979

[51] Int. Cl.$^3$ .............................................. C23C 3/02
[52] U.S. Cl. .................................... 427/98; 427/108; 427/259; 427/282; 427/287; 427/304; 427/305; 427/306; 430/315
[58] Field of Search .................. 427/98, 259, 304–306, 427/282, 287, 108; 430/315

[56] References Cited

U.S. PATENT DOCUMENTS

| | | |
|---|---|---|
| 3,485,665 | 12/1969 | De Angelo et al. . |
| 3,671,311 | 6/1972 | Tarnopol et al. . |
| 3,694,250 | 9/1972 | Grunwald et al. . |
| 3,772,075 | 11/1973 | Tarnopol et al. .................... 106/1.11 |
| 3,873,360 | 3/1975 | Lando . |
| 3,877,981 | 4/1975 | Arnold . |
| 4,016,307 | 4/1977 | Collaris et al. . |
| 4,029,942 | 6/1977 | Levin ................................. 428/339 |

FOREIGN PATENT DOCUMENTS 1304387  1/1973  United Kingdom ...................... 427/98

OTHER PUBLICATIONS

Feldstein, "Selective Electroless Plating Techniques: A Survey" *Plating*, Aug. 1970.

*Primary Examiner*—John D. Smith
*Attorney, Agent, or Firm*—W. Douglas Carothers, Jr.

[57] ABSTRACT

The method of selectively depositing a metal pattern on the surface of a laminar film comprising a dielectric substrate having a co-extensive metallic layer and a ceramic overlayer. A desired metallic pattern may be formed on the surface of the film by applying a releaseable mask in those regions of the film surface where plating of the surface is not desired, catalyzing the unmasked regions of the film surface, removing the mask from the film surface and thereafter immersing the film in an electroless plating bath whereby only the catalyzed regions are plated with the electroless metal of the bath. The preferred film has gold intermediate layer upon which electroless nickel or copper pattern plating is accomplished.

5 Claims, 1 Drawing Figure

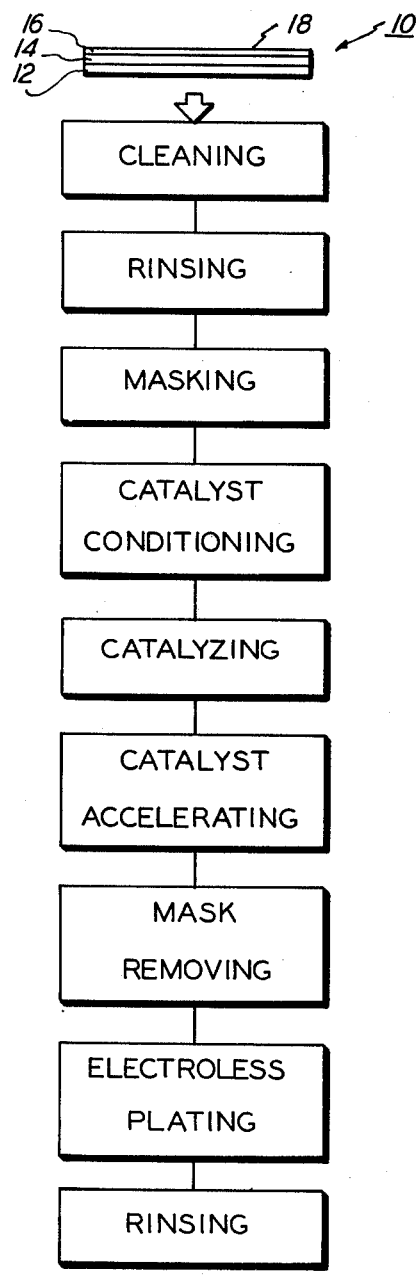

SELECTIVELY ELECTROLESSLY DEPOSITING A METAL PATTERN ON THE SURFACE OF A LAMINAR FILM

This invention relates generally to thin film processing and more particularly to the production of desired patterns on low resistance, conductive and highly transparent laminar film and, in particular, a film known as Intrex film produced by the Sierracin Corporation of Sylmar, Calif.

Intrex film comprises a polyester base on which is a co-extensive transparent gold coating or layer followed by a very thin ceramic layer to improve adhesion, scratch resistance and transparency of the film. These films are very rugged and of low cost. The film is available in a variety of sheet resistivities which range from approximately 5 to 30 ohms per square. Major uses of this film includes de-icing or defogging layers for aircraft and automobile windshields.

U.S. Pat. No. 4,029,942 shows the application of a thin low resistance, conductive film as an electrically heatable element for defrosting or defogging windshields and back windows of automobiles. By applying conductive bus bars along apposite edges of a sheet of this material, an electrical current can be applied to the bus bars. The elongated bus bars are to assure that uniform current distribution is obtained and uniform heating over the area of the sheet can be achieved. The bus bars are generally flexible elongated copper foil bus bars and may be applied according to the disclosure in U.S. Pat. No. 3,612,745. In general, the application has been by employing a conductive adhesive to secure the copper foils directly to the surface of the film. While this application has been successful, it does not assure uniform securing of the bus bar along the sheet edge and, thus, does not assure that their will be uniform distribution of the current to be applied to the low resistance, conductive transparent film or sheet. The cost of this process is very high and the thickness of the bus bar material complicates the process of laminating this sheet between other materials, such as, glass.

There are many other applications for this type film where a metal pattern applied to the film surface may be desired. Some examples are tansparent radiant or convection heaters, transparent electrodes for electro-optical displays, office environment graphics and infrared shielding or passive reflectors.

What is desired in these types of applications is the ability to provide local regions of high conductivity to improve heat uniformity and provide current distribution bus bars which facilitate the connection of these films to external power sources.

SUMMARY OF THE INVENTION

According to the invention, a method is provided for selectively depositing a metal conductive pattern onto a low resistance, conductive laminar film. In particular the method disclosed provides a technique in which an electroless nickel or copper or nickel-copper-phosphorous alloy or copper alloy may be plated in a desired design or pattern or a gold-based, resistive film known as Sierracin Intrex film.

Basically the method includes the steps of coating the surface of such a film with a releasable mark in those regions (pattern) where plating of the thin film is not desired. This is followed by catalyzing the unmasked regions of the film surface. Next, the mask is removed from the film surface. Finally, the film with catalyzed pattern regions is immersed into an electroless plating bath whereby only the catalyzed regions are plated with the electroless metal of the bath.

The advantages achieved by mask removal prior to plating are two fold. First, in prior applications, it was necessary to maintain the mask on the film surface due to the nature of the bath employed or because the mask, itself, was provided in nonpattern areas to perform the masking function in the bath. In order to protect the mask in these hot baths and provide good plating pattern resolution, it is preferred to bake or heat mask as applied to the film surface. The baking would further harden the mask. This heightens the difficulty of mask removal after plating since the mask has been previously hardened. This difficulty is accentuated where fine line masking pattern is being employed on the film surface.

Secondly, by leaving the mask pattern on the film surface during plating, the mask, itself, will also be plated along with the desired pattern intended for electroless plating. The uniform plating of the entire film surface makes it difficult to remove the mask from underneath the plated metal.

The present invention provides a simple and very convenient method by which plating of a low resistance, conductive film can be accomplished without the above mentioned difficulties and not require the use of a mask during electroless plating. The method herein disclosed will provide excellent nickel or copper bus bars of uniform current distribution quality for windshield applications previously alluded to above.

Other objects and attainments together with a fuller understanding of the invention will become apparent and appreciated by referring to the following description, example and claims taken in conjunction with the accompanying drawing.

DESCRIPTION OF THE DRAWING

The FIGURE shows in block diagram the specific steps that may be employed in following the method of selectively depositing a metal pattern on the surface of a low resistance, conductive laminar film.

DESCRIPTION OF THE PREFERRED EMBODIMENT

The method of the present invention is preferably utilized to form conductive patterns in Intrex type films. As shown in the FIGURE this film 10 comprises a transparent dielectric substrate 12 upon which is vacuum deposited a thin transparent, electrically conductive metallic film or layer 14. This metal layer 14 is overcoated with this ceramic coating. Typically, the thickness of the substrate 12 may be approximately 3 mils while the metallic layer 14 may be approximately 150-300 A thick. The ceramic overlayer 16 is even thinner, such as less than 100 A. This overlayer 16 does not appear to effect the overall electrical characteristics of the metallic layer 14.

The electrical characteristics of the film is specified primarily by the desired area or sheet resistivity (typically in the range from 5 to 30 ohms per square), the resistivity being determined by the thickness of the metal layer 14, which may be varied during fabrication. The thin conductive layer 14 is gold and the substrate 12 is a polyester material, such as, Mylar. the ceramic overlayer 16 serves to increase visible light transmission and provide mechanical protection to the conductive gold layer. The ceramic layer 16 also exhibits substantial electrical conductivity through its thickness, thus allowing the direct fabrication of bus bars and other such conductive layers and patterns directly to the thin film surface 18.

The method disclosed functions to provide a means for selective pattern plating of a low resistance conductive thin film 10 by submersion of the film into an electroless bath of either nickel or copper. The regions of the film surface 18 that are not desired to be plated are masked and those regions that are desired to be plated are catalyzed with a catalytic solution. The catalytic bath provides, in general, nucleating sites on the surface 18 of the film.

The masked regions of the film surface 18 upon removal of the mask, will not become subsequently plated in the electroless bath. This result is unexpected since it is known in the employment of electroless baths that attempts to plate catalized regions of a conductive film 10 will also commence to plate along the borders between catalized and uncatalized regions and thence proceed on plating into exposed and uncatalized regions of the film. This behavior is believed due to a self induced galvanic effect that is established between the metallic layer of the film and the electroless metal in the bath. However, it has been found that gold will not form a galvanic partner with electroless nickel or copper, but rather, the electroless nickel or copper will deposit only on catalyzed regions of the gold layered film 10.

The basic method is best illustrated by reference to the Figure. First, the Intrex film 10 may be cleaned in a conditioner for a small period of time and then rinsed in water. Conventional photolithographic techniques are then employed to define the regions or patterns which is to be catalyzed and plated.

Next is the catalyzing process. This may comprise the consecutive immersion of the film 10 into a preconditioner to cleanse the film surface 18 to be catalyzed, thence into a catalytic bath and finally into an accelerator which removes excess catalysis material and renders the catalytic agent more reactive.

Next, the mask is removed with a solvent, leaving a gold layered film with catalyzed and uncatalyzed regions. The film 10 is then immersed into an electroless nickel or copper bath wherein plating only occurs in catalyzed regions of the film 10. The film is left immersed in the electroless bath until the desired thickness in the plating is achieved.

Once the plating process is complete, the film 10 is removed from the bath, rinsed and then dried. The film with plated metalized regions or patterns is now ready for use.

From the foregoing description, it can be seen that the selective depositing method of this invention provides a much simpler and lower cost method for forming conductive patterns on a low resistance, conductive film 10, like Intrex film, without the need of applying a conductive pattern by employing a conductive adhesive or by plating the entire surface 18 of the film 10 and thereafter etching the plating from the surface of the film where the plating is not desired by employing, for example, lithographic techniques. The method disclosed is less time consuming, requiring less steps and can be accomplished with better pattern definition.

In order to more fully understand the manner in which the method of this invention is carried out, the following examples are given relative to the use of Intrex film. This example is intended for the purposes of clarity in carrying out the attainments of this invention and is not to be construed to limit the invention to any particular form, such as, the particular electroless baths employed.

EXAMPLE I

A pattern consisting of conductive nickel pads, 1.4 cm square, were plated onto Intrex film consisting of a 5 mil polyester substrate having a 26 ohm per square gold coating on its surface with a very thin ceramic overlayer.

The film was first cleaned by immersion in a conditioner at room temperature for about 5 minutes. The conditioner employed is a bath of 20% diluted Circubond 1200 Conditioner manufactured by Shipley Company. The diluent was deionized water.

The film was then rinsed and dried. A layer of Du Pont Riston 211R dry film photoresist was applied in the desired pattern of squares. The photoresist was exposed and developed, providing 1.4 cm exposed square openings on the film surface.

The film was then catalyzed by successive immersions in a diluted bath of Shipley's Cataprep 404 conditioner at room temperature for three minutes, a diluted bath of Shipley's Cataposit-44 palladium-tin catalyst at room temperature for 3 minutes, and Shipley's Accelerator 19 in a 20% deionized diluted water bath at room temperature for about four minutes.

On removal from the accelerator bath, the film was rinsed in water and the Riston photoresist was removed with acetone and isopropal alcohol.

After drying off the residual acetone and isopropyl alcohol, the film was immersed in a bath of Shipley's Niculoy-22 electroless nickel. The temperature of the bath was 90° to 95° C. The Niculoy alloy (approximately 85% nickel, 2% copper and the remainder, phorphorous) plated only on those regions that had been previously catalyzed, the 1.4 cm square patterns. After several minutes in the plating in the bath, a shiny low resistance conductive pattern was deposited on the catalyzed regions. The deposited regions were less than a mil thick with good pattern resolution and with no overplating into noncatalyzed regions.

Upon removal from the plating bath, the film was rinsed in deionized water and dried. The film was then ready for use, such as, attachment of the plated pads to a current source and use in a radiant heating application.

EXAMPLE II

In this example, the plating of nickel bus bars on opposite edges of sheets of Intrex film was performed. The steps of cleaning, rinsing and masking were done in the same manner as set forth in Example I.

Each sheet of film was then consecutively immersed in catalyst conditioning, catalyzing and catalyst accelerating bath for 5 minutes each. Each bath was maintained at room temperature. The conditioning bath was comprised of Shipley's Cataprep-404 Conditioner and consisted of a mixture of 680 grams of 404 powder with 2535 ml of deionized water. The catalyzing bath was comprised of Shipley's Cataposit-44 and consisted of a mixture of 680 grams of 404 powder, 155 ml of 44 concentrate with 2380 ml of deionized water.

After catalyzing, the film sheets were rinsed a couple of times in cold water.

The film sheets were then immersed in an accelerating bath which was comprised of Shipley's Accelerator- 19 and consisted of a mixture of 420 ml. of Accelerator-19 concentrate with 2115 ml of deionized water.

Next, the photoresist was removed and the film sheets dried in the same manner explained in Example I.

The film sheets were then immersed in an electroless nickel plating bath commercially available from Allied Chemical Corporation and comprised of 7.5 parts of "C1" concentrate, 3.5 parts of "C2" concentrate, 9.0 parts of "C3" concentrate and 80 parts of deionized water, parts being by volume of concentrate per 100 parts final volume. The plating bath was maintained at a temperature of 86° C. The plating baths should be at 85° C. or above but not allowed to boil.

The sheets remained immersed in the plating bath to provide bus bars of desired thickness, such as, 1 mil. Upon removal from the plating bath, the film sheets were rinsed in deionized water and then dried. The film sheets were then ready for their intended application.

Other electroless baths may be used, such as, Shipley's 328 electroless copper bath. Also numerous other resist materials could be employed for the masking step such as, liquid photoresists, screen printable resists and the like.

It should be apparent the advantages obtained in being able to have mask removal occur prior to plating. One is able to use electroless plating baths that may attack or dissolve photoresists. In other words, one need not be concerned about photoresist attack when selecting an electroless plating bath.

As a further example, fine line photoresists, like Shipley's AZ-1350, may be employed which would normally dissolve in a weak base electroless bath, such as, Shipley's Niculoy-22. This is an excellent combination of masking and electroless plating materials for practice of the method of this invention where fine metal line pattern is desired and/or a metal pattern having a very uniform plating distribution is desired, to provide a low electrical resistance, high abrasive resistant metal pattern deposit.

Also, as previously indicated, the method of this invention eliminates additional processing steps, such as, the necessity to bake the masking material to harden it for the hot plating bath thereby making it difficult in its removal especially if fine line masking has been employed. The catalyzing treatment will not harden or otherwise effect the photoresist masking material.

Also the method disclosed eliminates the need for the difficult removal of masking material after plating.

While the invention has been described in conjunction with specific embodiments and examples, it is evident that various alternatives, modifications and variations will be apparent to those skilled in the art in light of the foregoing description. Accordingly, it is intended to embrace all such alternatives, modifications, and variations as fall within the spirit and scope of the appended claims.

What is claimed is:

1. The method of selectively depositing a metal pattern on the surface of a laminar film without employing a pattern mask, said film having a conductive surface and comprising a thin low resistance, conductive layer co-extensive with a thin gold underlayer on a dielectric substrate, and comprising the steps of
   coating with a releasable mask those regions of the film surface where plating of the film surface is not desired,
   catalyzing the unmasked regions of the film surface where plating is desired,
   removing the mask from the film surface without affecting the catalyzed regions, and
   thereafter immersing the film with catalyzed pattern regions in an electroless plating bath whereby only the catalyzed regions are plated with the electroless metal of the bath.

2. The method of claim 1 wherein the electroless metal is either electroless nickel or copper.

3. The method of claim 1 or 2 wherein a palladium-tin catalyst is employed in said catalyzing step.

4. The method of selectively depositing a metal pattern on an essentially metallic surface of an electrically conductive low resistance laminar film without the employment of a pattern mask during deposition of the metal pattern, said film comprising a dielectric substrate upon which is consecutively deposited a contiguous thin gold layer and a contiguous extremely thin low resistance and electrically conductive overlayer, the steps thereof comprising
   forming with a releasable mask a pattern on the film surface where plating is not desired,
   catalyzing the unmasked regions of the film surface where plating is desired,
   removing the mask from the film surface, and
   immersing the film in a plating bath of either electroless nickel or electroless copper whereby plating is only induced on the catalyzed pattern regions of the film surface without a self induced galvanic behavior developing in the exposed uncatalyzed regions of the film surface.

5. The method of claim 4 wherein the step of catalyzing the unmasked regions of the film surface includes the steps of employing a preconditioning treatment and a post accelerating treatment to aid in the catalyzing.

* * * * *